United States Patent [19]

Nishino et al.

[11] Patent Number: 5,299,094

[45] Date of Patent: Mar. 29, 1994

[54] IC CARD INCLUDING MULTIPLE SUBSTRATES BEARING ELECTRONIC COMPONENTS

[75] Inventors: Kiyotaka Nishino, Sanda; Shigeo Onoda, Itami; Takaaki Okidono; Takashi Arita, both of Kawanishi, all of Japan

[73] Assignee: Mitsubishi Denki Kabushiki Kaisha, Tokyo, Japan

[21] Appl. No.: 973,654

[22] Filed: Nov. 9, 1992

[30] Foreign Application Priority Data

Jan. 8, 1992 [JP] Japan .................................. 4-001419

[51] Int. Cl.$^5$ ............................................ H05K 1/14
[52] U.S. Cl. .................................... 361/784; 361/748; 361/761; 361/807; 361/810; 174/52.1; 174/255; 257/678; 257/686; 257/700
[58] Field of Search ............... 361/395, 397, 399, 400, 361/401, 412, 415, 417, 420, 736, 748, 752, 760, 761, 784, 792, 796, 807, 810; 174/52.1, 255, 260; 257/678, 686, 700

[56] References Cited

U.S. PATENT DOCUMENTS 4,730,232  3/1988  Lindberg ............................ 361/381

FOREIGN PATENT DOCUMENTS 0303730  12/1989  Japan .................................. 437/208
2243493  10/1991  United Kingdom .

Primary Examiner—Leo P. Picard
Assistant Examiner—Young Whang
Attorney, Agent, or Firm—Leydig, Voit & Mayer

[57] ABSTRACT

An IC card includes a main substrate and a plurality of sub-substrates. Each sub-substrate has two surfaces on which electronic components are installed. The sub-substrates are mounted on both surfaces of the main substrate within the IC card. Openings in the main substrate receive electronic components installed on the sub-substrates. Such an arrangement makes it possible to provide four layers of electronic components within an IC card.

5 Claims, 4 Drawing Sheets

IC CARD INCLUDING MULTIPLE SUBSTRATES BEARING ELECTRONIC COMPONENTS

BACKGROUND OF THE INVENTION

1. Field of the Invention

The present invention relates to the structure of an IC card and more particularly, to the structure inside an IC card.

2. Description of the Related Art

FIG. 7 is a perspective view of an IC card 1; FIG. 8 is a plan view of a conventional substrate incorporated into the IC card of FIG. 7 and FIG. 9 is a cross-sectional view taken along line 9—9 of FIG. 7. A plurality of electronic components 3 are installed on the obverse and reverse surfaces of a substrate 2. The electronic components 3 are connected to circuit patterns 2b on the obverse surface of the substrate 2. A caulking hole 2a is located at the center of the substrate 2. A connector 6 includes a plurality of external connecting terminals 6a which are separate from the substrate 2. The external connecting terminals 6a, each linked to the circuit patterns 2b on the substrate 2, electrically connect the electronic components 3 on the substrate 2 to the outside of a housing.

The substrate 2 and the connector 6 are supported by the inside of a frame 4. FIG. 9 shows how the substrate 2 is supported by the inside of the frame 4. A support 4a extends through the center of the frame 4 from one end of the inside of the frame 4 to the other and in a direction at right angles with line 9—9 of FIG. 7. The support 4a is provided to a caulking portion 4b at the center thereof. The substrate 2 not only is supported by the support 4a and supporting portions 4c at both ends of the frame 4, but also is fixed to the inside of the frame 4 by caulking with the aid of the caulking hole 2a and the caulking 4b. The connector 6 is also supported by the inside of the frame 4. The portion of the frame 4 to which the connector 6 is attached is shaped so that the connector 6 can fit into it. For example, a sub-frame (not shown) presses the connector 6 in place downwardly, thus fixing it to the inside of the frame 4 in such a way that the sub-frame is mated with the inside. The illustrations of these portions are omitted.

Panels 5a and 5b are bonded by an adhesive or the like to the obverse and reverse surfaces of the frame 4, respectively. The substrate 2, together with the connector 6, is accommodated in a housing composed of the frame 4 and the panels 5a and 5b. The panels 5a and 5b are usually made of metal in order to protect the electronic components from static from outside the IC card, a magnetic field, physical external force, and the like.

Because of the thus-constructed conventional IC card, electronic components can be installed merely on both surfaces of the substrate. Since electronic components can be installed only to the extent that the substrate can accommodate them, the number of electronic components to be installed is limited.

SUMMARY OF THE INVENTION

Accordingly, the object of the present invention is to provide an IC card on which many more components are installed, and which has many more functions or a larger capacity than the conventional IC card.

In order to achieve the above object, according to this invention, there is provided an IC card comprising: sub-substrates each having an obverse surface and a reverse surface, at least one electronic component installed on either the obverse surface or the reverse surface; a main substrate having an obverse surface and a reverse surface, at least one of the sub-substrates being installed on either the obverse surface or the reverse surface of the main substrate, at least one opening for receiving the electronic component in the main substrate penetrating from the obverse surface to the reverse surface so that either the obverse surface or the reverse surface of the main substrate comes into contact with the reverse surface of the sub-substrate; a housing containing the main substrate onto which the sub-substrate is installed so and covering the sides of the main substrate; and electrical connecting means for electrically connecting the electronic component outside of the housing.

In the IC card of the invention, the sub-substrates, each having two surfaces onto which the electronic components are installed, are mounted on both surfaces of the main substrate. It is thus possible to obtain four layers on which the electronic components are installed. The opening in the main substrate receives the electronic components installed on the internal surfaces of the sub-substrates.

DESCRIPTION OF THE PREFERRED EMBODIMENTS

Figure 8:
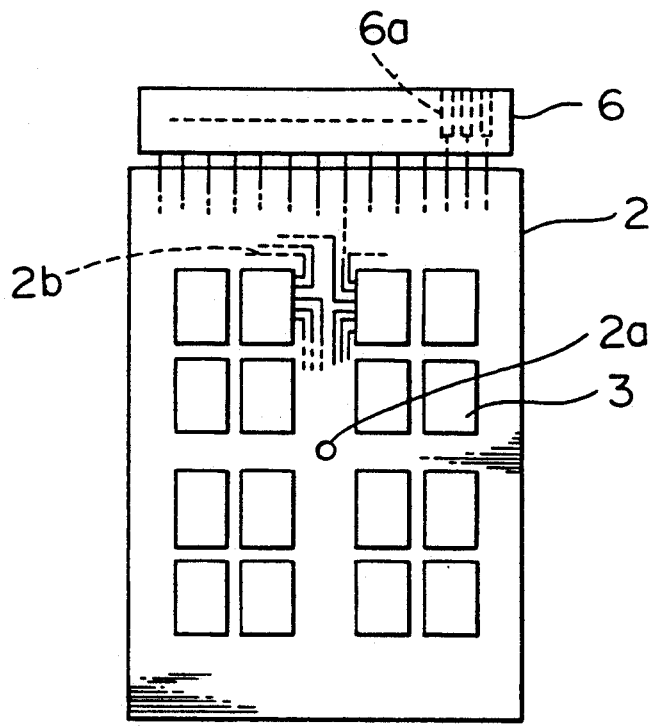
FIG. 8 is a plan view of the substrate and the connector incorporated into the conventional IC card.
Figure 9:
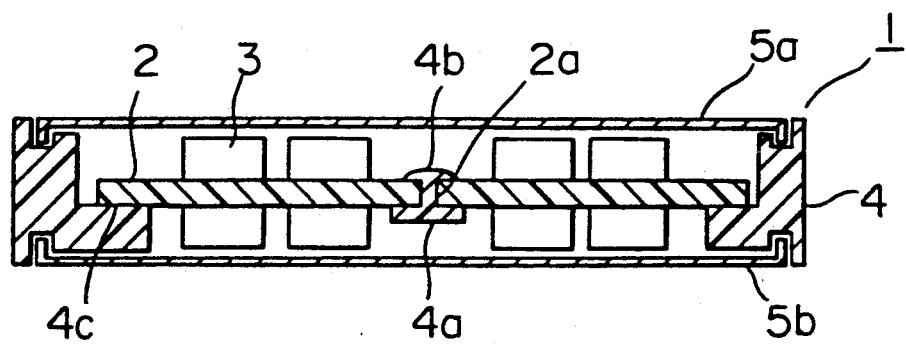
FIG. 9 is a cross-sectional view taken along line 9—9 of FIG. 7.

The embodiments of the present invention will be described below with reference to the accompanying drawings. In FIGS. 1 through 6, parts identified by the same reference numerals as those in FIGS. 7 through 9 denote the identical or corresponding parts.

Figure 1:
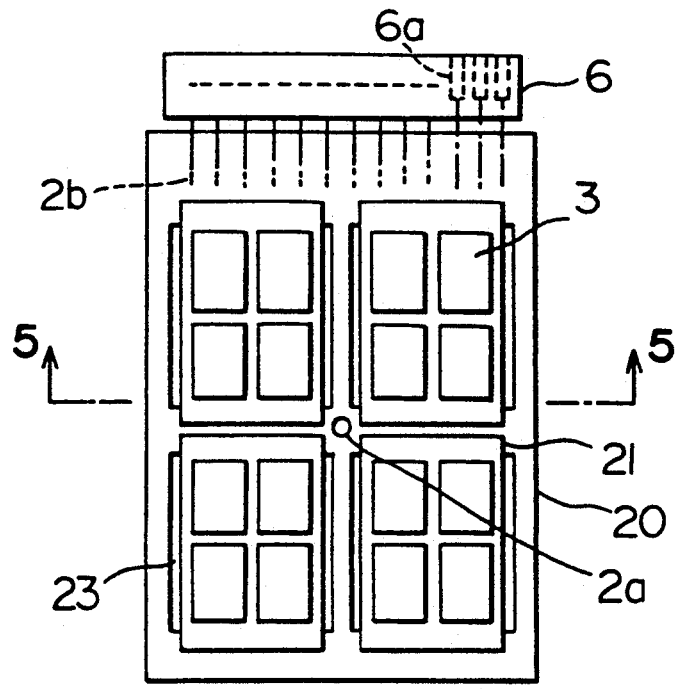
FIG. 1 is a plan view showing substrates and a connector incorporated in an IC card according to an embodiment of the present invention.
Figure 2:
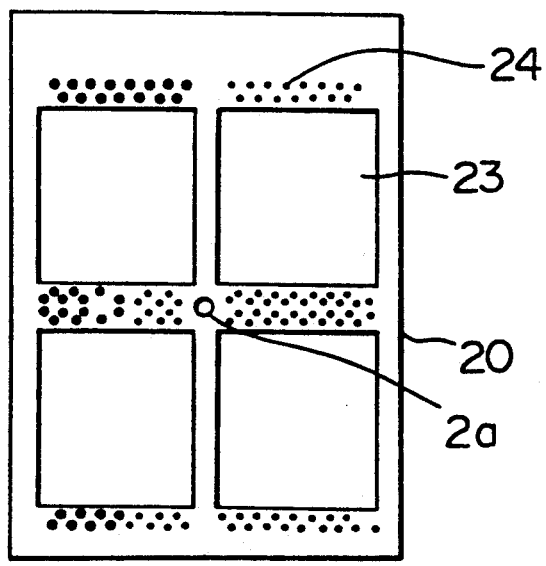
FIG. 2 is a plan view of a main substrate shown in FIG. 1.
Figure 3:
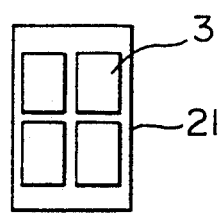
FIG. 3 is a plan view showing the obverse surface of one of the sub-substrates illustrated in FIG. 1.
Figure 4:
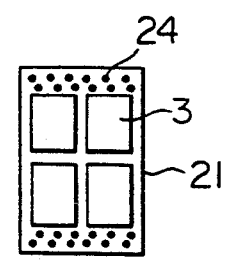
FIG. 4 is a plan view showing the reverse surface of the sub-substrate depicted in FIG. 3.
Figure 5:
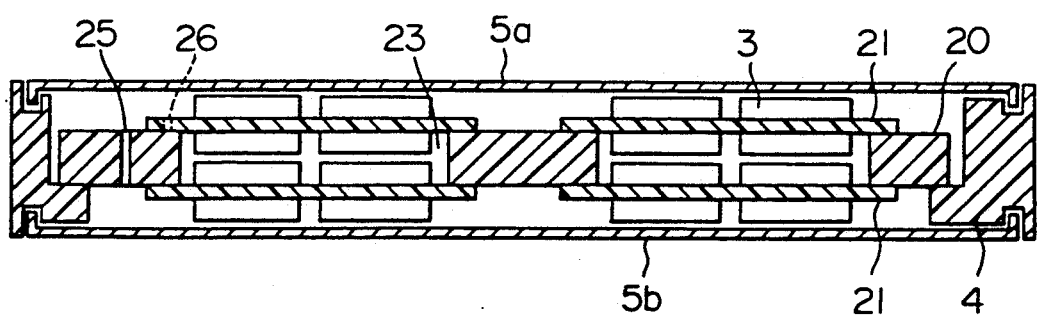
FIG. 5 is a cross-sectional view taken along line 5—5 of the IC card, shown in FIG. 1, according to the invention.
Figure 7:
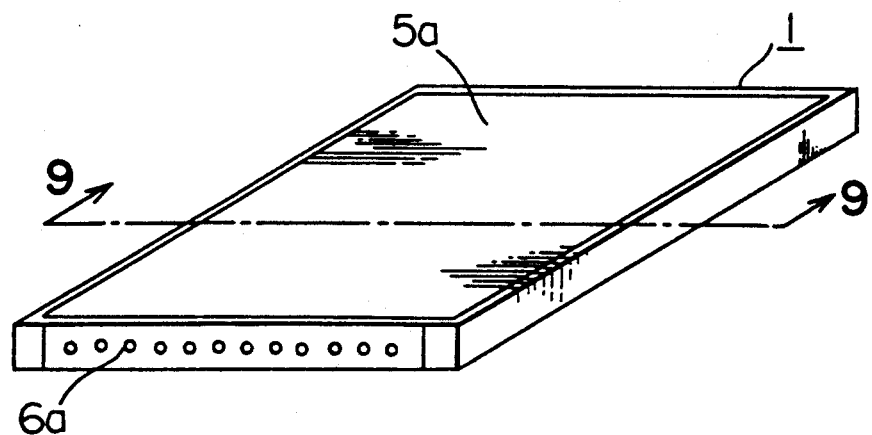
FIG. 7 is a perspective view of an IC card.

The outward appearance of an IC card in accordance with this invention is the same as that shown in FIG. 7. FIG. 1 is a plan view showing an embodiment in which substrates, together with a connector, are incorporated in the IC card according to the invention; FIG. 2 is a plan view of a main substrate 20, shown in FIG. 1, on which sub-substrates 21 are not mounted; FIGS. 3 and 4 are plan views showing respectively the obverse and reverse surfaces of one of the sub-substrates 21; and FIG. 5 is a cross-sectional view taken along line 5—5 of the IC card, shown in FIG. 1.

First, the structure of the IC card of this invention will be explained. As shown in FIG. 1, four sub-substrates 21 are mounted on the obverse surface of the main substrate 20. Similarly, another four sub-substrates 21 are mounted on the reverse surface of the main substrate 20 (see FIG. 5). As illustrated in FIGS. 3 and 4, electronic components are installed on both the obverse and reverse surfaces of each sub-substrate 21. Four openings 23, as shown in FIGS. 2 and 5, in the main substrate 20 penetrate from the obverse surface to the reverse surface of the main substrate 20. When the sub-substrates 21 are mounted on the main substrate 20, the openings 23 receive the electronic components installed on the reverse surfaces of the sub-substrates 21. Such arrangement causes the sub-substrates 21 to be mounted on the main substrate 20 so that the reverse surfaces of the sub-substrates 21 come into contact with the obverse or reverse surface of the main substrate 20. A connector 6 of FIG. 1, having a plurality of connecting terminals 6a, is separate from the main substrate 20. The connecting terminals 6a of the connector 6 are each connected to circuit patterns 2b on the main substrate 20, described below, and are electrically connected to the outside of the electronic components 3.

Next, means for electrically connecting the electronic components 3 will be briefly explained. The circuit patterns 2b (not shown in detail) are formed not only on both surfaces of the main substrate 20, but also on both surfaces of each sub-substrate 21. The electronic components 3 are connected to the circuit patterns 2b on the sub-substrates 21. The obverse and reverse surfaces of the main substrate 20 are electrically connected to each other with the aid of, for example, a through-hole 25 formed in the main substrate 20 shown in FIG. 5. Likewise, the obverse and reverse surfaces of each sub-substrate 21 are electrically connected to each other with the help of, for instance, a through-hole 26 in each sub-substrate 21 illustrated in FIG. 5. Moreover, the main substrate 20 is electrically connected to each sub-substrate 21 by electrodes 24, which, together with the circuit patterns, are located on both surfaces of the main substrate 20 and on the reverse surface of each sub-substrate 21, as shown in FIGS. 2 and 4. That is, when the sub-substrates 21 are, installed on the main substrate 20, the electrode 24 on either the obverse surface or the reverse surface of the main substrate 20 are connected electrically, as by soldering, to the electrodes 24 disposed on the reverse surfaces of the respective sub-substrates 21.

Then, together with the connector 6, the main substrate 20, on which the sub-substrates 21 are installed, is supported by the inside of a frame 4. The same structure used in the conventional art is employed for supporting and fixing the connector 6 and the main substrate 20. Panels 5a and 5b are bonded by an adhesive or the like to the obverse and reverse surfaces of the frame 4, respectively. The connector 6 and the main substrate 20, onto which the sub-substrates 21 are mounted, are contained in a housing composed of the frame 4 and the panels 5a and 5b. As depicted in FIG. 4, the connector 6 is mounted in the housing so that the external connecting terminals 6a are exposed at the end of the frame 4.

Thus, the substrates incorporated in an IC card 1 are constructed in such a manner that the sub-substrates 21 are installed on both surfaces of the main substrate 20, and electronic components 3 are in turn installed on both surfaces of each sub-substrate 21. It is therefore possible to provide four layers onto which many more electronic components can be installed than in the conventional IC card.

Figure 6:
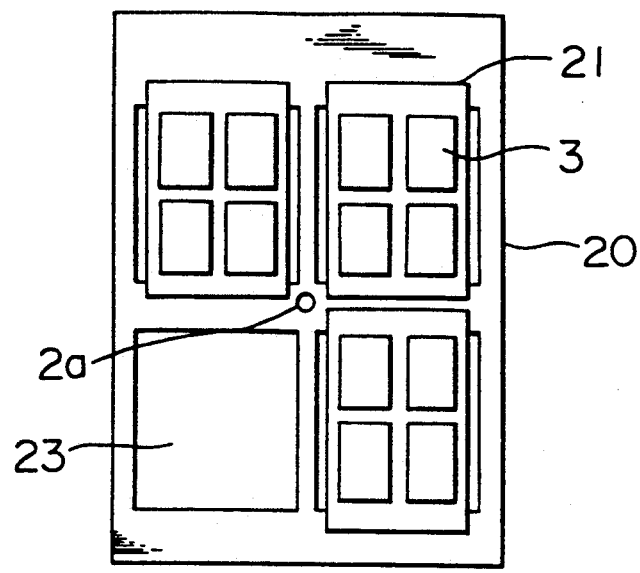
FIG. 6 is a plan view showing the structure of an IC card substrate in accordance with another embodiment of the invention.

In the embodiment previously described, although the sub-substrates 21 are positioned at all of the openings 23 in the main substrate 20, it is not necessary for the sub-substrates 21 to be positioned at all of the openings 23. The number of sub-substrates 21 may vary according to the memory capacity, function and other factors required for a given IC card. FIG. 6 shows the main substrate 20 having an opening 23 to which a sub-substrate 21 is not fixed. In addition, the number of openings 23 is not limited to four as in the above embodiment, but one, two, three, five or more openings may be present in the main substrate, and sub-substrates on which required electronic components are installed may be fixed to these openings.

As has been described above, in the IC card of the present invention, the sub-substrates are installed on both the obverse and reverse surfaces of the main substrate, and electronic components are in turn installed on both surfaces of each sub-substrate. It is therefore possible to obtain as many as four layers on which electronic components are installed, and thus to obtain IC cards having large capacities.

What is claimed is:

1. An IC card comprising:
   a plurality of sub-substrates, each sub-substrate having an obverse surface and a reverse surface and at least one electronic component installed on one of the obverse surface and the reverse surface;
   a main substrate having an obverse surface and a reverse surface wherein at least one of said sub-substrates is installed on one of the obverse surface and the reverse surface of said main substrate, said main substrate including at least one opening receiving said electronic component mounted on said sub-substrate and penetrating from the obverse surface to the reverse surface of said main substrate, the reverse surface of said sub-substrate contacting a surface of said main substrate;
   a housing containing said main substrate on which said sub-substrate is installed and covering said main substrate; and
   electrical connecting means for electrically connecting said electronic component outside of said housing.

2. The IC card as claimed in claim 1 wherein electronic components are installed on the obverse and the reverse surfaces of said sub-substrates and said sub-substrates are positioned on the obverse surface and the reverse surface of said main substrate, covering all of the openings.

3. The IC card as claimed in claim 1 wherein said main substrate has an opening where no sub-substrate is installed.

4. The IC card as claimed in claim 1 wherein said electrical connecting means includes circuit patterns on the obverse and reverse surfaces of said main substrate and the obverse and reverse surfaces of said sub-substrates: a through-hole in said main substrate penetrating from the obverse surface to the reverse surface of said main substrate to provide an electrical connection between those two surfaces; a through-hole in said sub-substrate penetrating from the obverse surface to the reverse surface of said sub-substrate to provide an electrical connection between those two surfaces; a plurality of electrodes on both surfaces of said main substrate and on the reverse surface of said sub-substrate, the electrodes on said main substrate being connected to the electrodes on said sub-substrate; and a connector including a plurality of external connecting terminals connected to the circuit patterns on said main substrate and incorporated into said housing.

5. The IC card as claimed in claim 1 wherein said housing includes a frame covering sides of said main substrate and metallic panels bonded to the frame.

* * * * *